United States Patent
Aramata et al.

(10) Patent No.: US 7,109,811 B2
(45) Date of Patent: *Sep. 19, 2006

(54) VOLTAGE CONTROLLED OSCILLATOR, COMPOSITE MODULE, AND COMMUNICATION APPARATUS

(75) Inventors: Tomohide Aramata, Komatsu (JP); Osamu Oe, Komatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 8 days.

This patent is subject to a terminal disclaimer.

(21) Appl. No.: 10/746,661

(22) Filed: Dec. 26, 2003

(65) Prior Publication Data

US 2005/0128015 A1 Jun. 16, 2005

(30) Foreign Application Priority Data

Jan. 31, 2003 (JP) ............................. 2003-023836

(51) Int. Cl.
*H03B 1/00* (2006.01)
(52) U.S. Cl. .............................. 331/117 D; 331/107 SL
(58) Field of Classification Search ............ 331/117 D, 331/117 R, 107 SL, 108 D
See application file for complete search history.

(56) References Cited

U.S. PATENT DOCUMENTS 5,347,238 A * 9/1994 Kobayashi .............. 331/117 R
5,945,884 A * 8/1999 Nakatsuka .............. 331/117 R
6,104,255 A * 8/2000 Goma et al. ............ 331/117 D

FOREIGN PATENT DOCUMENTS

JP 11-074727 3/1999
JP 2002-171130 A 6/2002
JP 2002-359519 A 12/2002

OTHER PUBLICATIONS

Official Communication issued in corresponding Korean Patent Application 10-2004-0004713, dated May 25, 2006.
English translation of Official Communication issued in the corresponding Korean Patent Application No. 10-2004-0004713, dated May 25, 2006.

* cited by examiner

*Primary Examiner*—Joseph Chang
(74) *Attorney, Agent, or Firm*—Keating & Bennett, LLP

(57) ABSTRACT

A resonant circuit includes a choke coil, a variable-capacitance diode, coupling capacitors, a resonant capacitor, a resonator defining an inductor element, and a bypass capacitor. An amplifying circuit includes a buffer amplifying transistor, an oscillating transistor, bias resistors, Colpitts capacitors, bypass capacitors, a coupling capacitor, a choke coil, a resonant capacitor, and a resonant inductor. A bias resistor has one end electrically connected to the base of the oscillating transistor and has the other end electrically connected to the ground via the resonator having one end electrically grounded.

14 Claims, 8 Drawing Sheets

VOLTAGE CONTROLLED OSCILLATOR, COMPOSITE MODULE, AND COMMUNICATION APPARATUS

BACKGROUND OF THE INVENTION

1. Field of the Invention

The present invention relates to a voltage-controlled oscillator, a composite module, and a communication apparatus.

2. Description of the Related Art

FIG. 5 is a circuit diagram of a conventional voltage-controlled oscillator 1. The voltage-controlled oscillator 1 includes a resonant circuit 2 and an amplifying circuit 3. The resonant frequency of the resonant circuit 2 changes according to a control voltage Vc applied to a control terminal 4. The amplifying circuit 3 oscillates a signal based on the resonant frequency of the resonant circuit 2 and amplifies the signal.

Referring to FIGS. 6 and 7, the circuits 2 and 3 of the voltage-controlled oscillator 1 typically include various electronic components (described below) mounted on or formed inside a circuit substrate 10, which is produced by integrally firing multilayered ceramic sheets having circuit patterns or ground electrodes printed thereon. In FIGS. 6 and 7, the circuit substrate 10 includes a control terminal 4, a driving power terminal 5, an output terminal 6, inter-layer connecting terminals 7 to 9, and a ground terminal G. The circuit substrate 10 further includes wiring patterns 12a to 12e, a via hole 11a, and a through-hole 11b. In addition to the components described above, the circuit substrate 10 has on its upper surface other wiring patterns, via holes, and through-holes, which are not shown in FIGS. 6 and 7.

The resonant circuit 2 includes a choke coil L1, a variable-capacitance diode D1, coupling capacitors C9 and C10, a resonant capacitor C11, a resonator (strip line or microstrip line) SL2 which is an inductor element, and a bypass capacitor C12.

The amplifying circuit 3 includes a buffer amplifying transistor Tr1, an oscillating transistor Tr2, bias resistors R1, R2, R3, and R4, Colpitts capacitors C4, C5, C6, and C7, bypass capacitors C1 and C3, a coupling capacitor C2, a choke coil (strip line or microstrip line) SL1, a resonant capacitor C8, and a resonant inductor (strip line or microstrip line) SL3 which is an inductor element.

Japanese Unexamined Patent Application Publication No. 11-74727 discloses another well-known voltage-controlled oscillator, which has a different circuit from that according to preferred embodiments of the present invention. In this voltage-controlled oscillator, the emitter of a transistor is connected to the ground not only via a capacitor and a bias resistor, but also via a resonator connected to a node between the bias resistor and the capacitor.

Referring again to FIG. 5, the bias resistor R3 in the amplifying circuit 3 has one end electrically connected to the base of the transistor Tr2 and the other end directly connected to the ground. One approach for connecting the bias resistor R3 to the ground is via the wiring pattern 12a that is provided on the circuit substrate 10, as shown in FIG. 6, so as to electrically connect the bias resistor R3 to the ground terminal G.

This approach, however, prevents chip components from being mounted in an area S1 because the area S1 overlaps the wiring pattern 12a. Therefore, this approach is not appropriate for compact design of the voltage-controlled oscillator 1. Another disadvantage of this approach is that the space available for a microstrip line is reduced which makes it difficult to form the resonator SL2 as a small-loss microstrip line.

Another approach, as shown in FIG. 7, is to form the through-hole 11b in the circuit substrate 10 such that the through-hole 11b electrically connects the bias resistor R3 to a ground electrode (not shown in the figures) on the lower surface of the circuit substrate 10. This approach eliminates the need for forming the wiring pattern 12a on the circuit substrate 10, and thus enables a chip component such as the bias resistor R1 to be mounted in the area S1.

Unfortunately, this approach has a disadvantage in that the area for the resonator (strip line or microstrip line) SL2 inside the circuit substrate 10 is restricted by the through-hole 11b which prevents an area S2 from being utilized, as shown in FIG. 8. Thus, this approach is also not appropriate for compact design of the voltage-controlled oscillator 1. In particular, the resonator SL2 which is defined by a strip line requires the formation of the via hole 11a for electrically connecting between strip lines on the surfaces and the inner layers of the circuit substrate 10, which further restricts the component layout and internal layer patterns.

SUMMARY OF THE INVENTION

To overcome the problems described above, preferred embodiments of the present invention provide a voltage-controlled oscillator, a composite module, and a communication apparatus that is designed to be compact and that to achieve less-restricted component layouts and internal layer patterns.

According to a preferred embodiment of the present invention, a voltage-controlled oscillator includes a resonant circuit including an inductor element having one end thereof electrically connected to a ground, and an amplifying circuit including a transistor and a resistor. In this voltage-controlled oscillator, the resistor has one end thereof electrically connected to the base of the transistor and the other end thereof electrically connected to the ground via the inductor element.

According to another preferred embodiment of the present invention, a voltage-controlled oscillator includes a circuit substrate which includes a laminate of a plurality of insulating layers and a plurality of electrodes. The circuit substrate further includes a resonant circuit including an inductor element having one end thereof electrically connected to a ground, and an amplifying circuit including a transistor and a resistor. At least one of the transistor and the resistor is mounted on the circuit substrate. In this voltage-controlled oscillator, the resistor has one end thereof electrically connected to the base of the transistor and the other end thereof electrically connected to the ground via the inductor element. The inductor element may be formed of a microstrip line, a strip line, or a chip coil or other suitable element.

The above-described inductor element functions as an inductor or a resonator in the high-frequency (AC) range, and moreover, functions as a short-circuit element in the DC range. Thus, in the DC range, the inductor element is utilized as a ground electrode to which the resistor is connected as described above. This advantage shortens the wiring to the ground. In addition, it is not necessary to provide a wiring pattern or through-hole in the circuit substrate. This advantage creates free space on the surface and inside the circuit substrate for mounting an electronic component and for forming a circuit pattern, thereby enabling a compact voltage-controlled oscillator to be designed.

According to another preferred embodiment of the present invention, a composite module or communication apparatus includes the compact voltage-controlled oscillator according to various preferred embodiments described above. Such a composite module and a communication apparatus are also designed to be compact and to have improved electrical characteristics.

The above and other elements, characteristics, features, steps and advantages of the present invention will become clear from the following description of preferred embodiments taken in conjunction with the accompanying drawings.

DETAILED DESCRIPTION OF PREFERRED EMBODIMENTS

Preferred embodiments of a voltage-controlled oscillator, a composite module, and a communication apparatus according to the present invention will now be described with reference to the attached drawings.

First Preferred Embodiment

Figure 1:
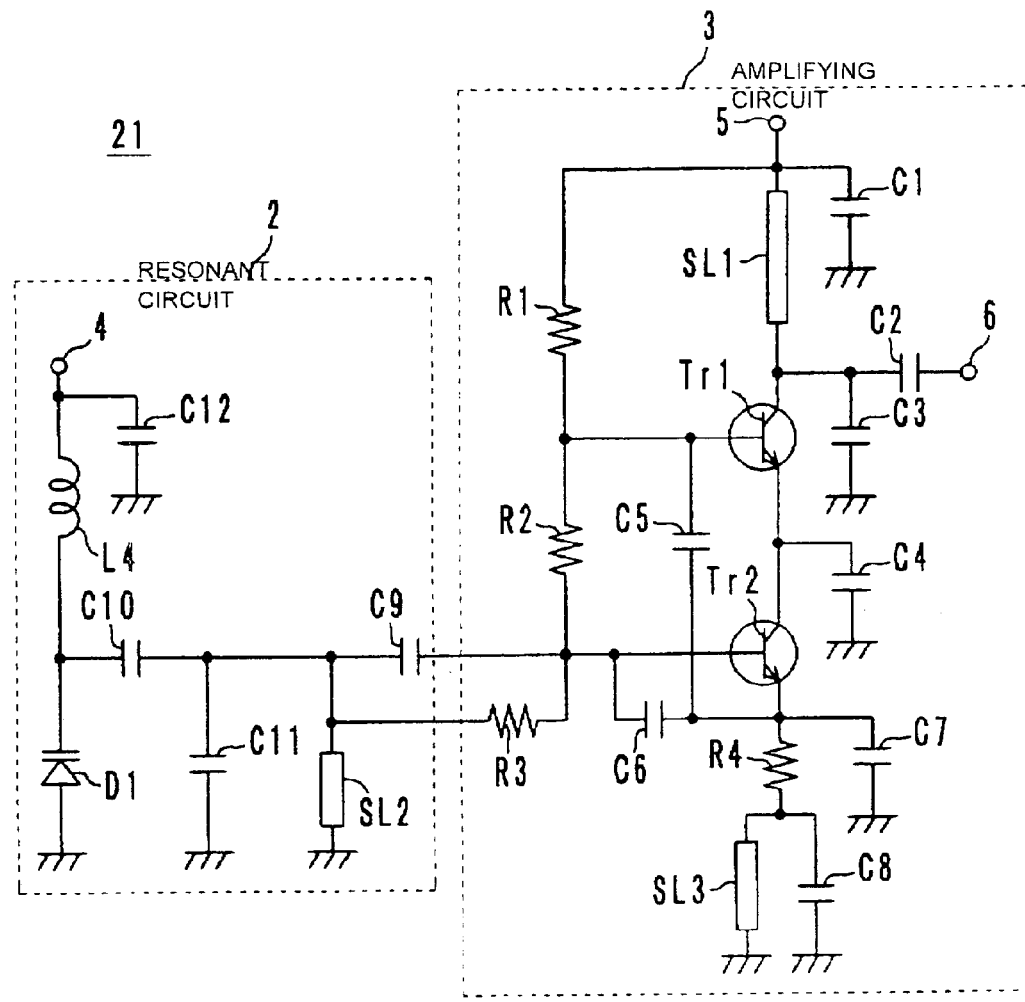
FIG. 1 is an electrical circuit diagram of a voltage-controlled oscillator according to a preferred embodiment of the present invention.

Referring to FIG. 1, a voltage-controlled oscillator 21 preferably includes a resonant circuit 2 and an amplifying circuit 3. The resonant frequency of the resonant circuit 2 is changed according to a control voltage Vc applied to a control terminal 4. The amplifying circuit 3 generates a signal based on the resonant frequency of the resonant circuit 2 and amplifies the signal.

Figure 2:
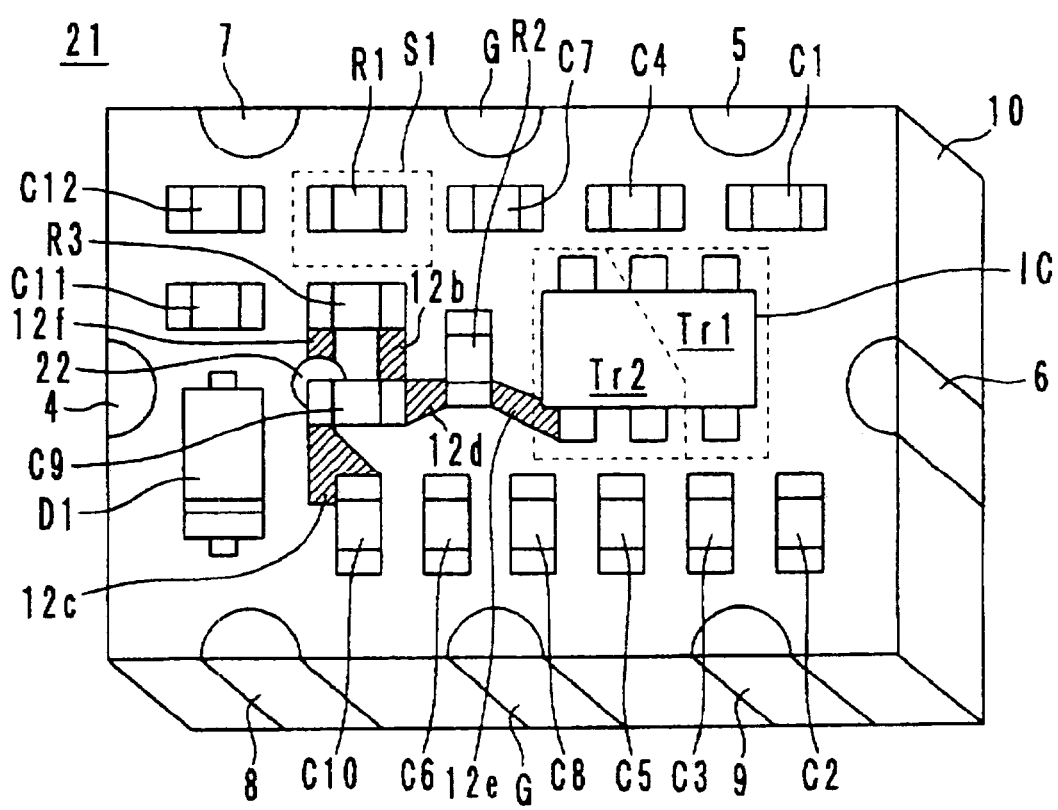
FIG. 2 is an external perspective view of a multilayer voltage-controlled oscillator incorporating the electrical circuit shown in FIG. 1.

Referring to FIG. 2, the circuits 2 and 3 of the voltage-controlled oscillator 21 typically include various electronic components (described below) mounted on or provided in a circuit substrate 10, which is produced by integrally firing multilayered ceramic sheets having circuit patterns or ground electrodes printed thereon. In FIG. 2, the circuit substrate 10 includes a control terminal 4, a driving power terminal 5, an output terminal 6, inter-layer connecting terminals 7 to 9, and a ground terminal G. The circuit substrate 10 further includes wiring patterns 12b to 12f and a via hole 22. In addition to the components described above, the circuit substrate 10 includes on its upper surface other wiring patterns, via holes, and through-holes, which are not shown in FIG. 2.

The resonant circuit 2 includes a choke coil L4, a variable-capacitance diode D1, coupling capacitors C9 and C10, a resonant capacitor C11, a resonator SL2 which is an inductor element, and a bypass capacitor C12.

Figure 3:
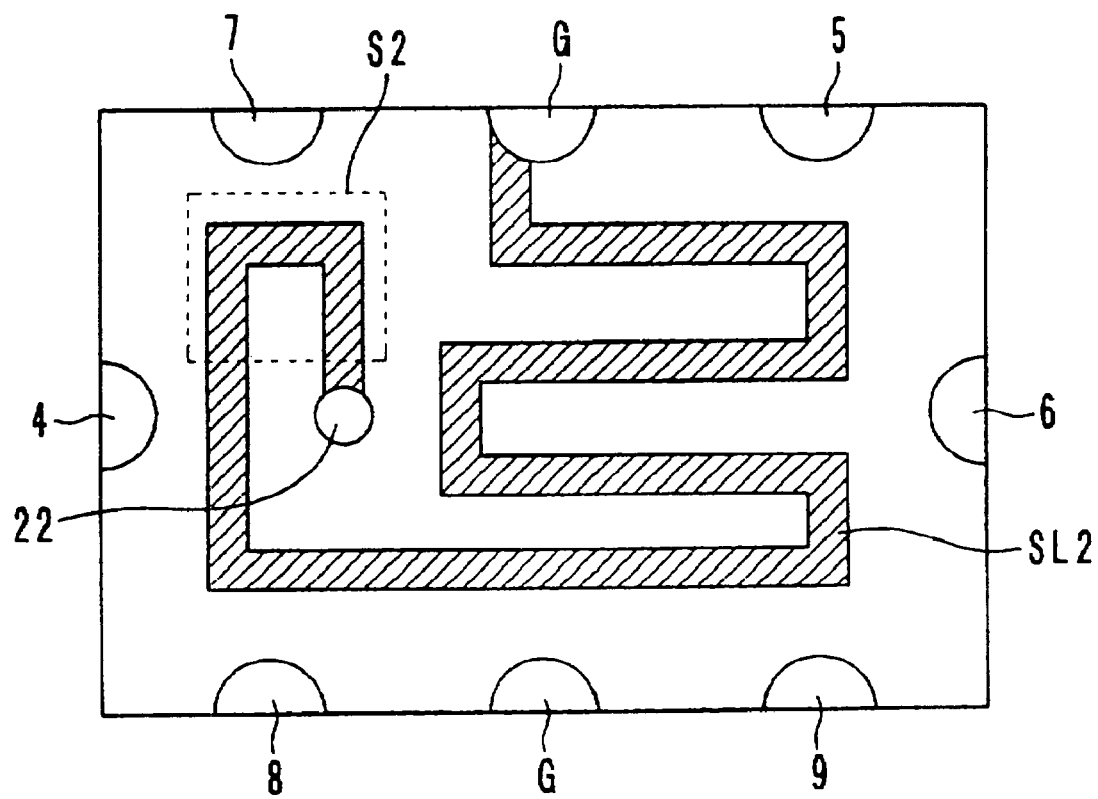
FIG. 3 is a plan view of an internal layer of the multilayer voltage-controlled oscillator shown in FIG. 2.

Chip components are used for the variable-capacitance diode D1, the coupling capacitors C9 and C10, the resonant capacitor C11, and the bypass capacitor C12. These chip components are surface-mounted on the circuit substrate 10. The choke coil L4 and the resonator SL2 are defined by circuit patterns printed on an insulating ceramic sheet. These circuit patterns are provided inside the circuit substrate 10. In particular, the resonator SL2 is defined by a strip line or a microstrip line, as shown in FIG. 3.

The strip line is defined as a signal line having an opposed ground electrode thereabove or therebelow such that the signal line and the ground electrode are separated from each other by an insulating ceramic sheet. The microstrip line is defined as a signal line having one ground electrode thereabove and another ground electrode therebelow such that each of the ground electrodes is separated from the signal line by an insulating ceramic sheet.

The control voltage Vc applied to the control terminal 4 is supplied to the variable-capacitance diode D1 via the choke coil L4. The control terminal 4 is grounded via the high-frequency bypass capacitor C12 in the high-frequency range. The variable-capacitance diode D1, the resonant capacitor C11, and the resonator SL2 are electrically connected in parallel with respect to the ground. It is noted that one end of the resonator SL2 is grounded.

The amplifying circuit 3 includes a buffer amplifying transistor Tr1, an oscillating transistor Tr2, bias resistors R1, R2, R3, and R4, Colpitts capacitors C4, C5, C6, and C7, bypass capacitors C1 and C3, a coupling capacitor C2, a choke coil SL1, a resonant capacitor C8, and a resonant inductor SL3.

Chip components are used for the integrated circuit component IC incorporating the buffer amplifying transistor Tr1 and the oscillating transistor Tr2, the bias resistors R1, R2, and R3, the Colpitts capacitors C4 to C7, the bypass capacitors C1 and C3, the coupling capacitor C2, and the resonant capacitor C8. These chip components are surface-mounted on the circuit substrate 10. The choke coil SL1, bias resistor R4, and the resonant inductor SL3 are preferably defined by circuit patterns or printed resistors printed on an insulating ceramic sheet. These circuit patterns and printed resistors are provided inside the circuit substrate 10. In particular, the choke coil SL1 and the resonant inductor SL3 are defined by a strip line or a microstrip line.

The resonant inductor SL3 and the resonant capacitor C8 together define a parallel resonant circuit section. The inductance value of the resonant inductor SL3 has a value such that parallel resonance with the resonant capacitor C8 at the oscillation frequency is produced. In this manner, the impedance viewed from the emitter of the oscillating transistor Tr2 to the ground via the bias resistor R4 is increased at the oscillation frequency.

The bias resistor R4 specifies the DC bias applied to the emitter of the oscillating transistor Tr2. That is, the emitter defines a current output terminal. The driving power terminal 5, via which a drive voltage Vb is applied to the cascade-connected buffer amplifying transistor Tr1 and the oscillating transistor Tr2, is grounded via the high-frequency bypass capacitor C1 in the high-frequency range.

Referring to FIGS. 2 and 3, the bias resistor R3 has one end thereof electrically connected to the base of the oscillating transistor Tr2 and the other end thereof grounded through the wiring pattern 12f and the via hole 22 provided in the circuit substrate 10 and further via the resonator SL2 having one end thereof electrically connected to the ground. The resonator SL2 having one end thereof electrically connected to the ground functions as a resonator in the high-frequency range (AC range) and as a ground in the DC range. Thus, the to-be-grounded end of the bias resistor R3 is connected to one end of the resonator SL2 functioning as the ground in the DC range such that this resonator SL2 is used as a ground electrode. This approach advantageously shortens the wiring to the ground.

Figure 6:
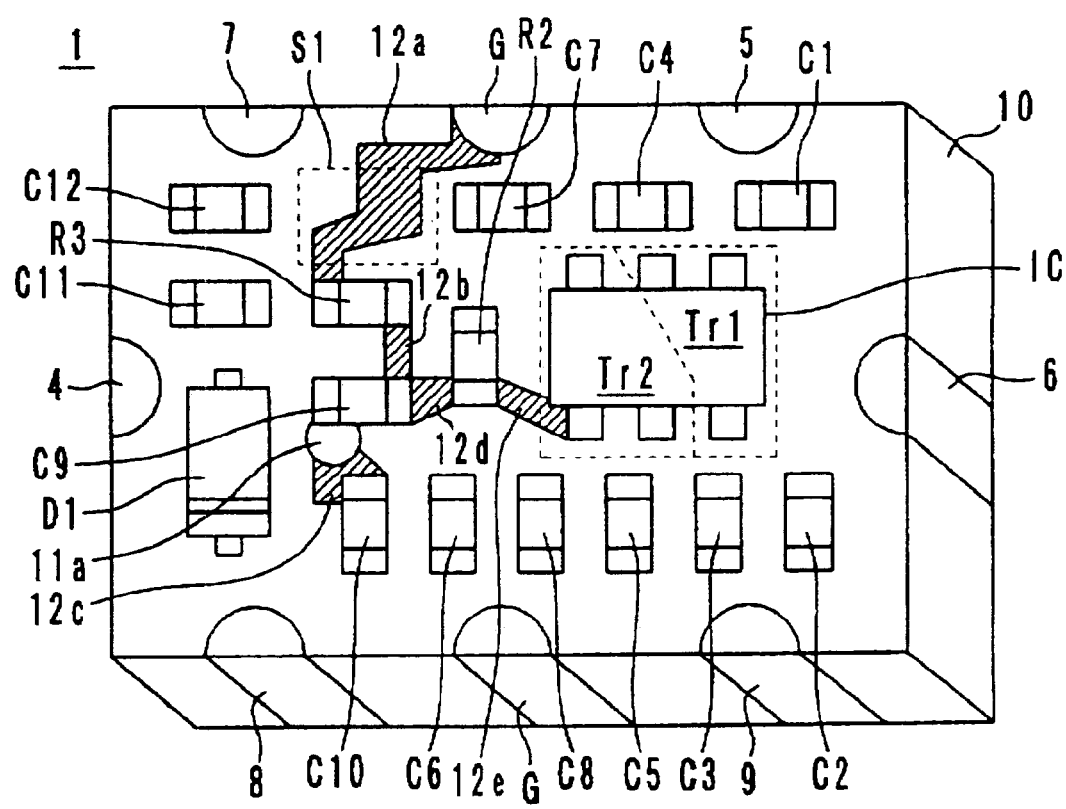
FIG. 6 is an external perspective view of a multilayer voltage-controlled oscillator incorporating the electrical circuit shown in FIG. 5.
Figure 7:
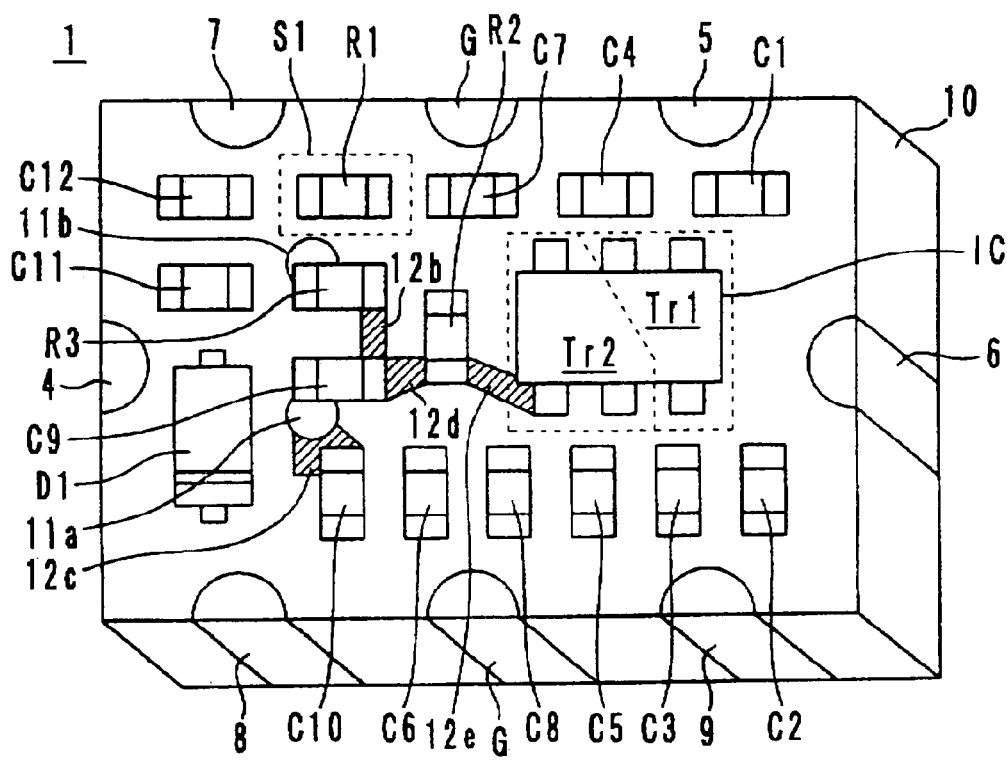
FIG. 7 is an external perspective view of a modification of the multilayer voltage-controlled oscillator shown in FIG. 6.
Figure 8:
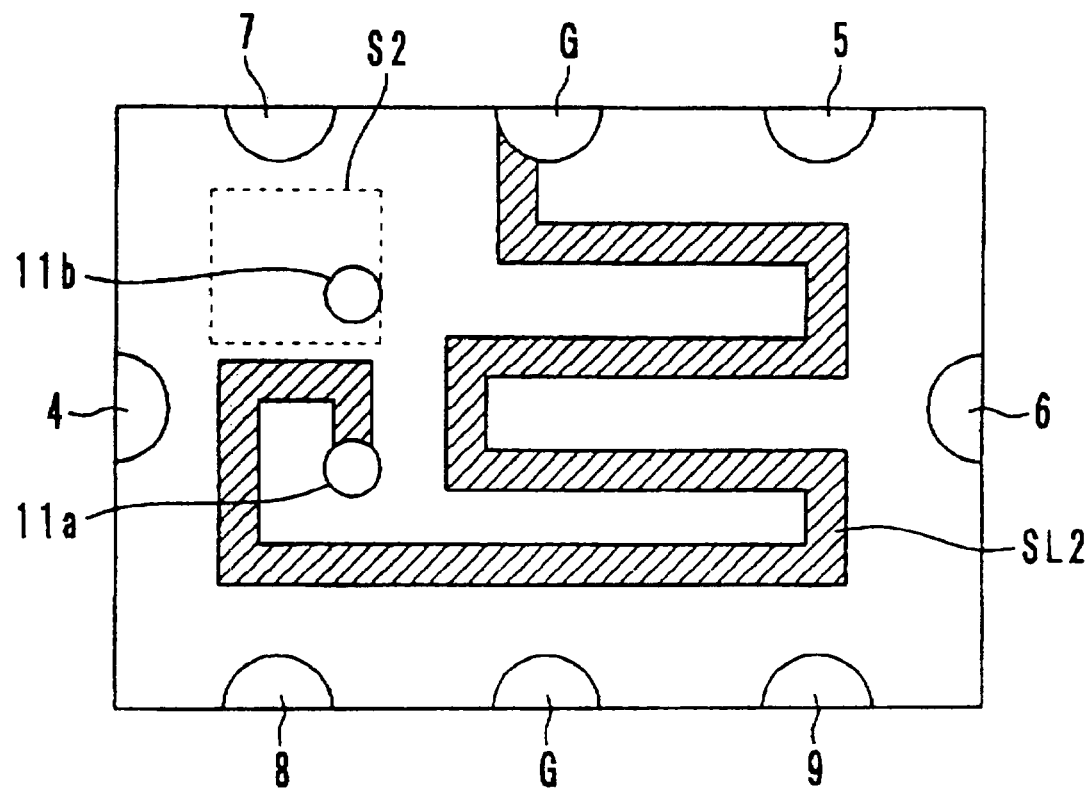
FIG. 8 is a plan view of an internal layer of the multilayer voltage-controlled oscillator shown in FIG. 7.

Unlike the conventional voltage-controlled oscillator 1 shown in FIGS. 6 and 7, it is not necessary to provide the wiring pattern 12a or the through-hole 11b which allows a component such as the bias resistor R1 to be mounted in the area S1 on the upper surface of the circuit substrate 10 and the resonator SL2 to be provided in the area S2 inside the circuit substrate 10. Consequently, the size of the voltage-controlled oscillator 21 is greatly reduced.

Furthermore, the free space on the surfaces of the circuit substrate 10 is increased to define a space for a ground electrode above and beneath the resonator SL2. Consequently, the resonator SL2 can be used as a small-loss microstrip line, which thereby greatly improves the noise performance.

The bias resistor R3 does not allow a high-frequency signal to pass therethrough, and therefore, the structure described above does not adversely affect the intrinsic function of the resonator SL2. In addition, a high-frequency signal passing through the resonator SL2 is prevented from entering the base of the oscillating transistor Tr2 via the bias resistor R3.

This voltage-controlled oscillator 21 operates as follows; the capacitance of the variable-capacitance diode D1 defining the resonant circuit 2 varies according to the value of the control voltage Vc; the resonant frequency of the resonant circuit 2 changes; the amplifying circuit 3 oscillates a signal based on the resonant frequency and amplifies the signal; and finally, a signal is output via the output terminal 6.

Second Preferred Embodiment

A second preferred embodiment will be described by way of an example of a mobile phone as a communication apparatus according to the present invention.

Figure 4:
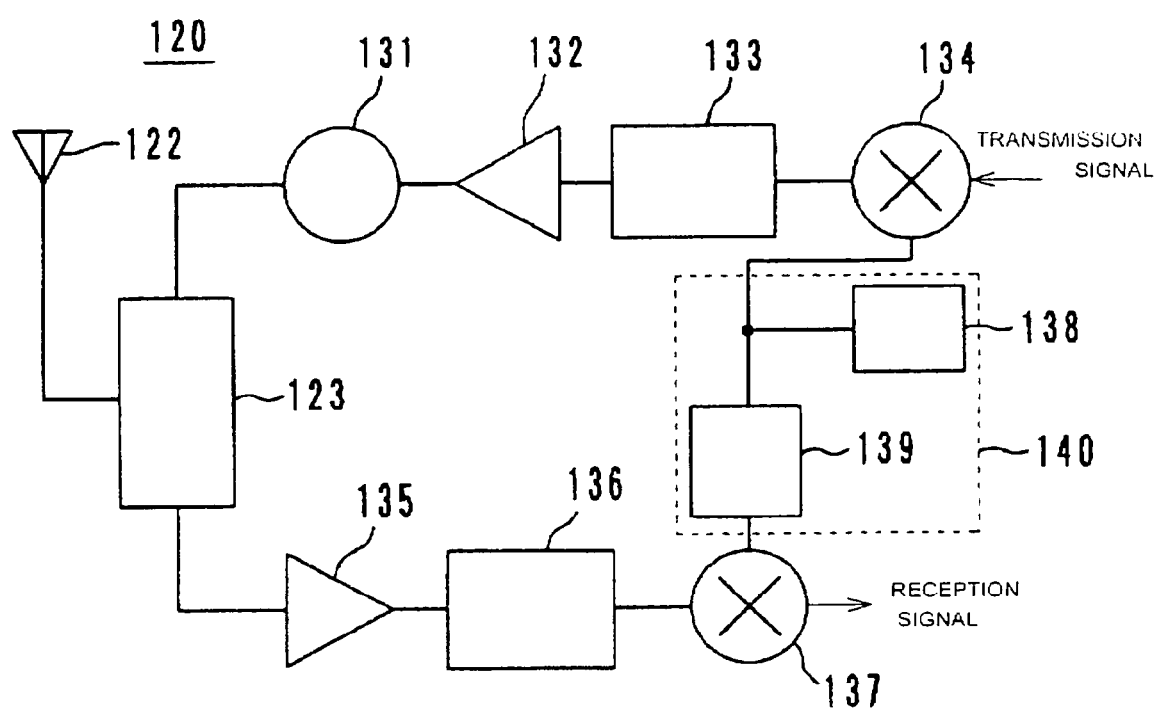
FIG. 4 is an electrical circuit block diagram of a communication apparatus according to another preferred embodiment of the present invention.
Figure 5:
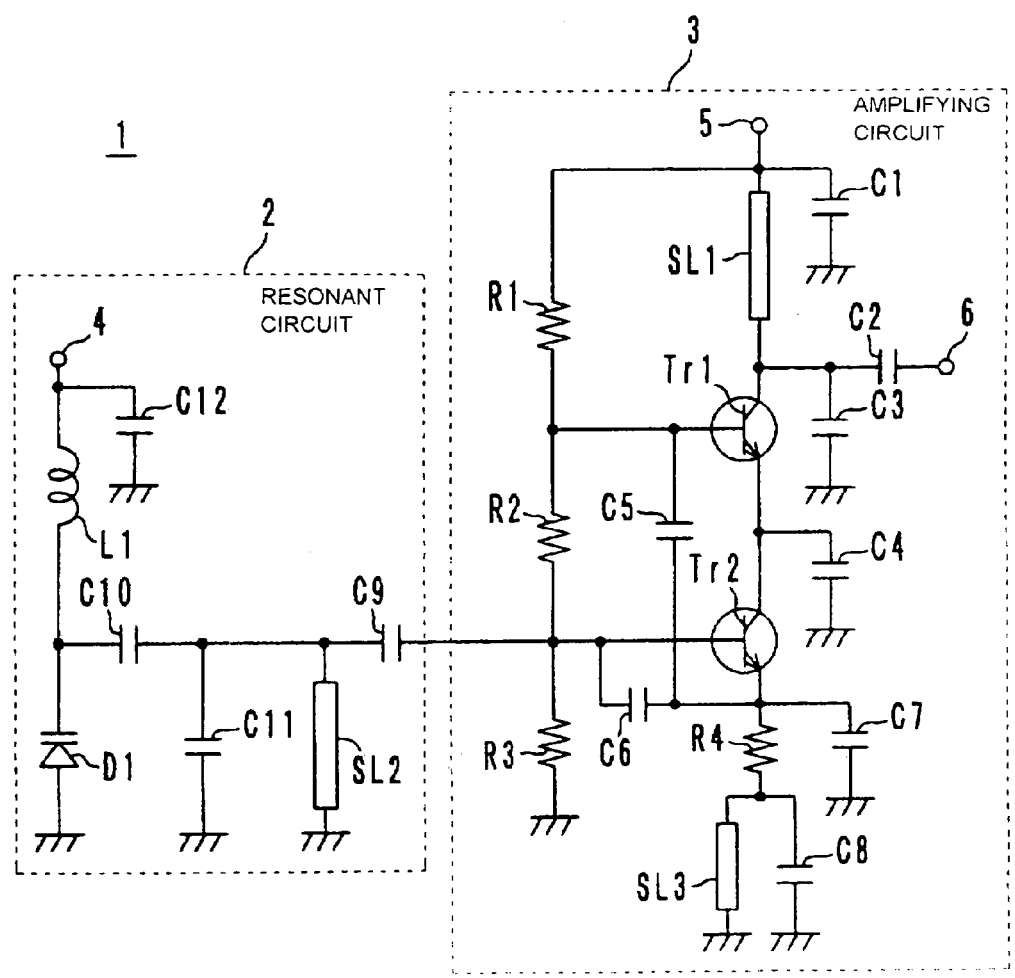
FIG. 5 is an electrical circuital diagram of a conventional voltage-controlled oscillator.

FIG. 4 is an electrical circuit block diagram of an RF section of a mobile phone 120. The mobile phone 120 includes an antenna element 122, a duplexer 123, a transmitter isolator 131, a transmitter amplifier 132, a transmitter inter-stage band pass filter 133, a transmitter mixer 134, a receiver amplifier 135, a receiver inter-stage band pass filter 136, a receiver mixer 137, a voltage-controlled oscillator 138, and a local band pass filter 139.

In the mobile phone 120, the voltage-controlled oscillator 138 and the local band pass filter 139 are integrated on a single circuit substrate as a circuit block, which is a composite module 140. For the voltage-controlled oscillator 138, the voltage-controlled oscillator 21 according to the first preferred embodiment of the present invention is preferably used. By implementing this composite module 140, a mobile phone 120 having enhanced electrical characteristics, greatly reduced size, and highly reliable performance is produced.

The present invention is typically described with reference to, but not limited to, the foregoing preferred embodiments. Various modifications are conceivable within the scope of the present invention. For example, the bias resistor R3 described in the first preferred embodiment may be a printed resistor formed on a surface or inside the multilayer product. The resonator SL2 and the resonant inductor SL3 may be chip coils.

The buffer amplifying transistor Tr1 and the oscillating transistor Tr2 may be connected to each other in a manner other than the cascade connection and the resonator SL2, and the variable-capacitance diode D1 may be connected in series. Furthermore, two voltage-controlled oscillators 21 may be connected in parallel such that they can be switched by switching means.

The to-be-grounded end of the bias resistor R3 may be connected to a midway point of the resonator SL2 functioning as the ground in the DC range. This also produces the same effect as with the voltage-controlled oscillator 21 according to the first preferred embodiment of the present invention.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A voltage-controlled oscillator comprising:
a resonant circuit including a first inductor element having one end thereof electrically connected to a ground; and
an amplifying circuit including a transistor, a first resistor and a second resistor, and a second inductor element having one end thereof electrically connected to ground; wherein
the first resistor has one end thereof electrically connected to a base of the transistor and the other end thereof electrically connected to the other end of the first inductor element; and
the second resistor has one end thereof electrically connected to an emitter of the transistor and the other end thereof electrically connected to the other end of the second inductor element.

2. The voltage-controlled oscillator according to claim 1, wherein at least one of the first and second inductor elements includes at least one of a microstrip line and a strip line.

3. The voltage-controlled oscillator according to claim 1, wherein at least one of the first and second inductor elements is a chip coil.

4. A voltage-controlled oscillator according to claim 1, wherein the amplifier circuit includes a buffer amplifying transistor, an oscillating transistor, bias resistors, Colpitts capacitors, bypass capacitors, a coupling capacitor, a choke coil, a resonant capacitor, and a resonant inductor.

5. A composite module comprising a circuit substrate including a first circuit block and a second circuit block, wherein the first circuit block is a voltage-controlled oscillator according to claim 1.

6. A communication apparatus comprising the voltage-controlled oscillator according to claim 1.

7. A communication apparatus comprising the composite module according to claim 5.

8. A voltage-controlled oscillator comprising:
a circuit substrate comprising:
a Jaminate of a plurality of insulating layers and a plurality of electrodes;

a resonant circuit including a first inductor element having one end thereof electrically connected to a ground; and an amplifying circuit including a transistor, a first resistor and a second resistor, and a second inductor element having one end thereof electrically connected to a ground; wherein at least one of the transistor and the resistor is mounted on the circuit substrate; and the first resistor has one end thereof electrically connected to a base of the transistor and the other end thereof electrically connected to the other end of the first inductor element; and the second resistor has one end thereof electrically connected to an emitter of the transistor and the other end thereof electrically connected to the other end of the second inductor element.

9. The voltage-controlled oscillator according to claim 8, wherein at least one of the first and second inductor elements includes at least one of a microstrip line and a strip line.

10. The voltage-controlled oscillator according to claim 8, wherein at feast one of the first and second inductor elements is a chip coil.

11. A voltage-controlled oscillator according to claim 8, wherein the amplifier circuit includes a buffer amplifying transistor, an oscillating transistor, bias resistors, Colpitts capacitors, bypass capacitors, a coupling capacitor, a choke coil, a resonant capacitor, and a resonant inductor.

12. A composite module comprising a circuit substrate including a first circuit block and a second circuit block, wherein the first circuit block is a voltage-controlled oscillator according to claim 8.

13. A communication apparatus comprising the voltage-controlled oscillator according to claim 8.

14. A communication apparatus comprising the composite module according to claim 12.

* * * * *